United States Patent [19]
Wu et al.

[11] Patent Number: 6,074,911
[45] Date of Patent: Jun. 13, 2000

[54] METHOD OF FABRICATING DUAL CYLINDRICAL CAPACITOR

[76] Inventors: King-Lung Wu, No. 6, Lane 131, Ching-Nien St., Chia-Li Town, Tainan Hsien; Chuan-Fu Wang, 3F, No. 5, Lane 397, Jen Ai St., Sanchung, Taipei Hsien, both of Taiwan

[21] Appl. No.: 09/183,579

[22] Filed: Oct. 30, 1998

[51] Int. Cl.$^7$ ................................................ H01L 21/8742
[52] U.S. Cl. .......................................... 438/253; 438/396
[58] Field of Search .................................. 438/244, 387, 438/243, 386, 253, 396, 212

[56] References Cited

U.S. PATENT DOCUMENTS 5,930,621  7/1999  Kang et al. .

*Primary Examiner*—George Fourson
*Attorney, Agent, or Firm*—Hickman Stephens Coleman & Hughes, LLP

[57] ABSTRACT

A method of fabricating a dual trench capacitor with a horn region is provided. On a semiconductor substrate having at least a device isolation structure and a transistor thereon, wherein the transistor includes at least a gate and a source/drain region, an insulation layer with an opening exposing the source/drain region is formed. The opening is partly filled with a conductive plug, the plug having a surface level lower than a surface level of the insulation layer, so that a trench with a side wall of the insulation layer is formed on the plug within the opening. A conductive spacer is formed on the side wall with a horn shape. A part of the insulation layer which encompassing the conductive plug and the conductive spacer is removed, so that a dual trench structure which exposes outer side walls of the conductive spacer and the conductive plug, and a part of the insulation layer is formed. A conformal conductive layer is formed to cover whole surfaces of the dual trench structure, the conductive spacer and the conductive plug, so that a bottom electrode formed by the conformal conductive layer, the conductive spacer and the conductive plug. A dielectric layer is formed on the bottom electrode. A top electrode is formed on the dielectric layer.

9 Claims, 4 Drawing Sheets

METHOD OF FABRICATING DUAL CYLINDRICAL CAPACITOR

BACKGROUND OF THE INVENTION

1. Field of the Invention

The invention relates in general to a method of fabricating a capacitor, and more particularly, to a method of fabricating a dual trench capacitor with a horn region in a dynamic random access memory (DRAM).

2. Description of the Related Art

As the functions of microprocessor become more and more versatile, the program and the calculation run by a software becomes more and more sizeable. The storing capacitance of a memory is required to be larger and larger. However, as the integration of semiconductors increases, the device or circuit is shrunk according to the design rule of the fabrication process, therefore, the storing capacitance of a capacitor is reduced.

The capacitor plays as a heart of a DRAM, the more charges the capacitor can store, the less it is affected by noise, for example, soft error caused by an α particle, while accessing data. Furthermore, the frequency of refresh can be reduced. Currently, methods such as fabricating a trench-shape capacitor and reducing the thickness of the dielectric layer are used to increase the capacitance of a capacitor. The latter one is often restricted by the yield and reliability of the product.

Recently, hemispherical-grain polysilicon and stack type bottom structures are used for bottom electrode to increase the surface area. However, the cell having a stack type bottom electrode often has a height higher than the periphery circuit region, therefore, causes the problems in cell planarization and metallization.

In addition, in the fabrication process of forming a capacitor, a photo-resist layer is used to define the structure of the capacitor. During the photolithography and etching process, if misalignment occurs, the result of etching is affected, and the faulty devices or product are increased.

SUMMARY OF THE INVENTION

It is an object of the invention to provide a method of fabricating a dual trench capacitor with a horn region. The dual trench capacitor is formed with an increased surface area, so that the capacitance is increased.

It is another object of the invention to provide a method of fabricating a dual trench capacitor with a horn region. The dual trench capacitor is formed with a surface level at about the same as the periphery circuit on a substrate. Therefore, an additional planarization process is not required for the following fabrication process, so that the reliability is enhanced, and the fabrication is simplified.

To achieve the above-mentioned objects and advantages, a method of fabricating a dual trench capacitor with a horn region is provided. On a semiconductor substrate having at least a device isolation structure and a transistor thereon, wherein the transistor includes at least a gate and a source/drain region, an insulation layer with an opening exposing the source/drain region is formed. The opening is partly filled with a conductive plug, the plug having a surface level lower than a surface level of the insulation layer, so that a trench with a side wall of the insulation layer is formed on the plug within the opening. A conductive spacer is formed on the side wall with a horn shape. A part of the insulation layer which encompassing the conductive plug and the conductive spacer is removed, so that a dual trench structure which exposes outer side walls of the conductive spacer and the conductive plug, and a part of the insulation layer is formed. A conformal conductive layer is formed to cover whole surfaces of the dual trench structure, the conductive spacer and the conductive plug, so that a bottom electrode formed by the conformal conductive layer, the conductive spacer and the conductive plug. A dielectric layer is formed on the bottom electrode. A top electrode is formed on the dielectric layer.

Both the foregoing general description and the following detailed description are exemplary and explanatory only and are not restrictive of the invention, as claimed.

DESCRIPTION OF THE PREFERRED EMBODIMENTS

Figure 1A:
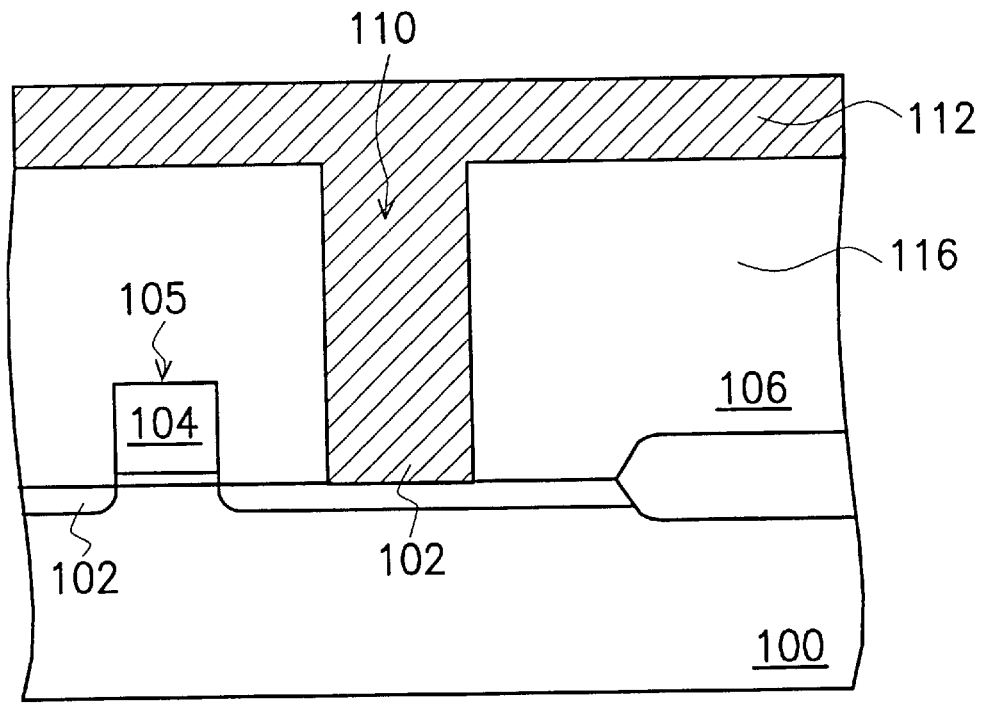
FIG. 1A to FIG. 1G shows a fabricating method of forming a dual trench capacitor in a preferred embodiment according to the invention.

FIG. 1A to FIG. 1G shows a method for forming a capacitor coupled with a source/drain region 103 among the source/drain regions 102 and 103 of a field effect transistor 105, a metal-oxide semiconductor (MOS) device in this embodiment, on a substrate 100. The MOS device 105 further comprises a gate 104 and is formed in an active region of the substrate 100. The active region is isolated by an isolation structure 106. It is appreciated that persons skilled in the art may also apply the fabrication method of forming a capacitor introduced in this embodiment to couple with conductive regions other than the source/drain region of a MOS device of a substrate. The substrate 100 is covered by an insulation layer 116 with an opening 110 exposing the source/drain region 103. A first conductive layer 112, for example, a doped polysilicon layer with a thickness of about 2000 Å is formed on the insulation layer 116 and to fill the opening 110 and couple with the source/drain region 103.

Figure 1B:
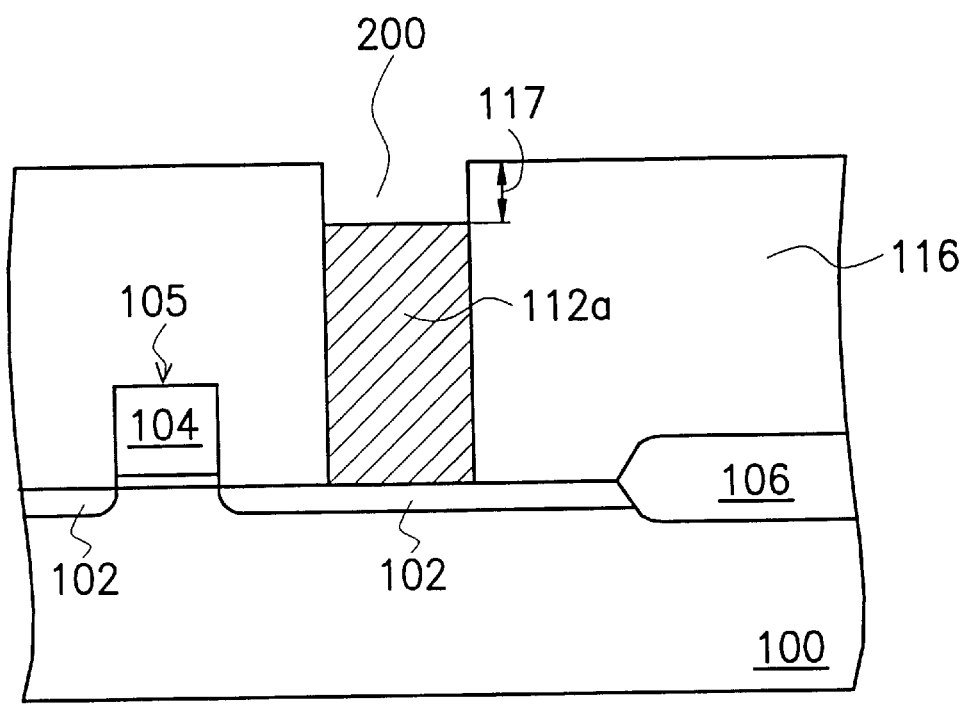

In FIG. 1B, the first conductive layer 112 is etched back, so that portions of the first conductive layer 112 on the insulation layer 116 and the upper part to fill the opening 110 are removed. As a consequence, the remaining first conductive layer fills the opening 110 as a plug 112a with a surface level lower than the surface level of insulation layer 116. Therefore, a trench 200 having a side wall of the insulation layer 116 is formed on the plug 112a within the opening 110.

Figure 1C:
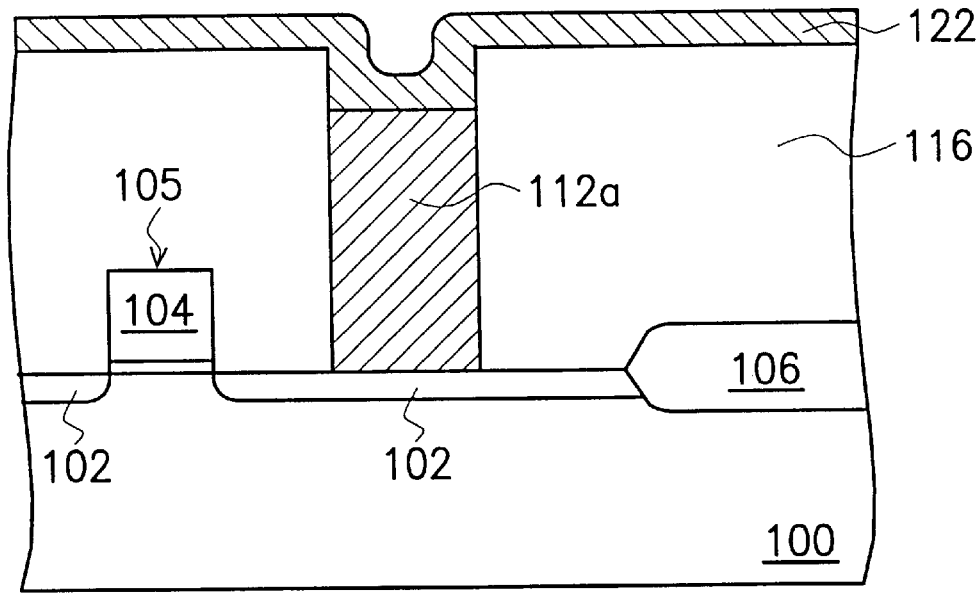
Figure 1D:
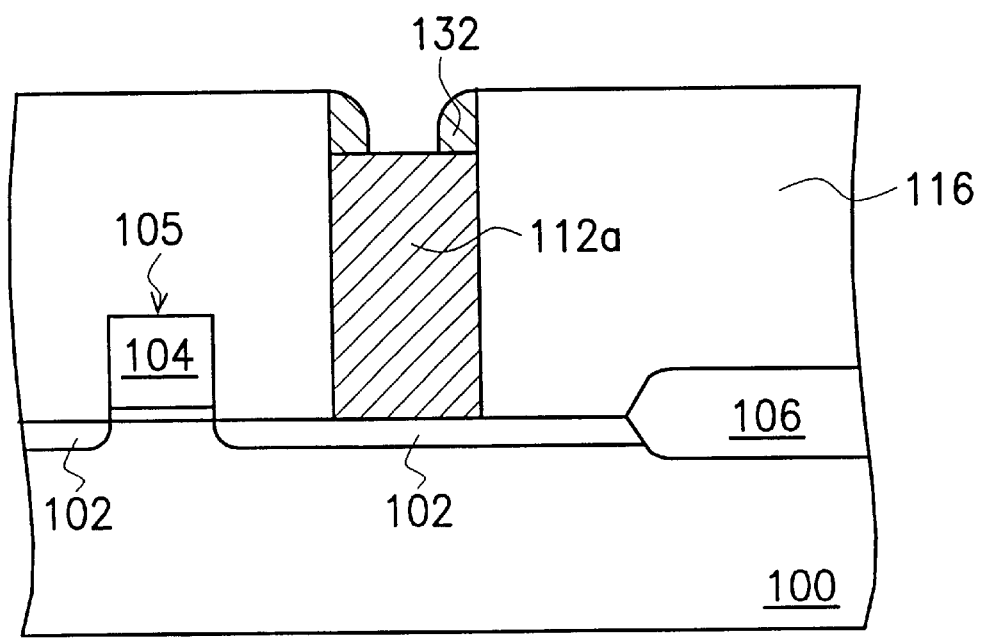

In FIG. 1C, a second conductive layer 122 is formed to cover the insulation layer 116 and the plug 112a. Preferably, the second conductive layer 122 is formed from the material of doped polysilicon layer with a thickness of about 500 Å, though other materials may also be used. The thickness of the second conductive layer 122 is determined by the depth 117 of the trench 200. Using etch back or chemical mechanical polishing, the part of the second conductive layer 122 on the insulation layer 116 is removed, while a conductive spacer 132 is formed on the plug 112a within the trench 200 on the side wall of the insulation layer 116 as shown in FIG. 1D. As shown in the figure, the plug 112a has a horn region 132 thereon.

Figure 1E:
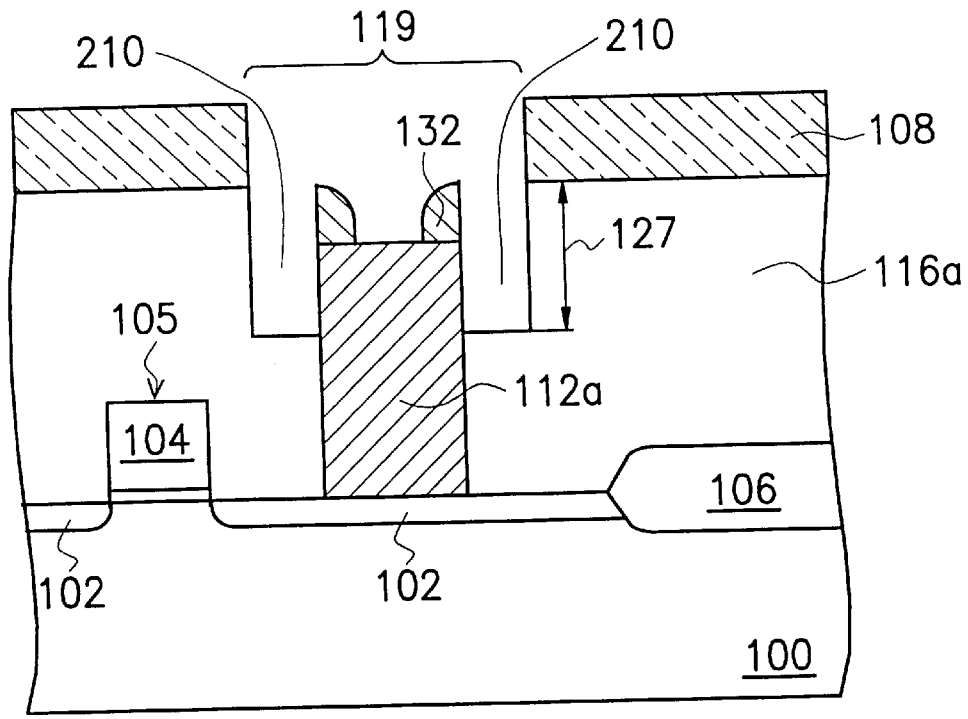

In FIG. 1E, a photo-resist layer 108 is formed to cover a part of the insulation layer 116. With the photo-resist layer 108 as a mask, the insulation layer 116 encompassing the plug 112a with the horn region 132 is removed with a thickness about 6000 Å, so that a bottom electrode region 119 comprising a dual trench structure 210 is defined. It is to be noted that the thickness of the insulation layer 116 to be removed depends on the depth of the plug 112a and the thickness of the whole insulation layer 116. The resultant insulation layer being removed is denoted as 116a.

Figure 1F:
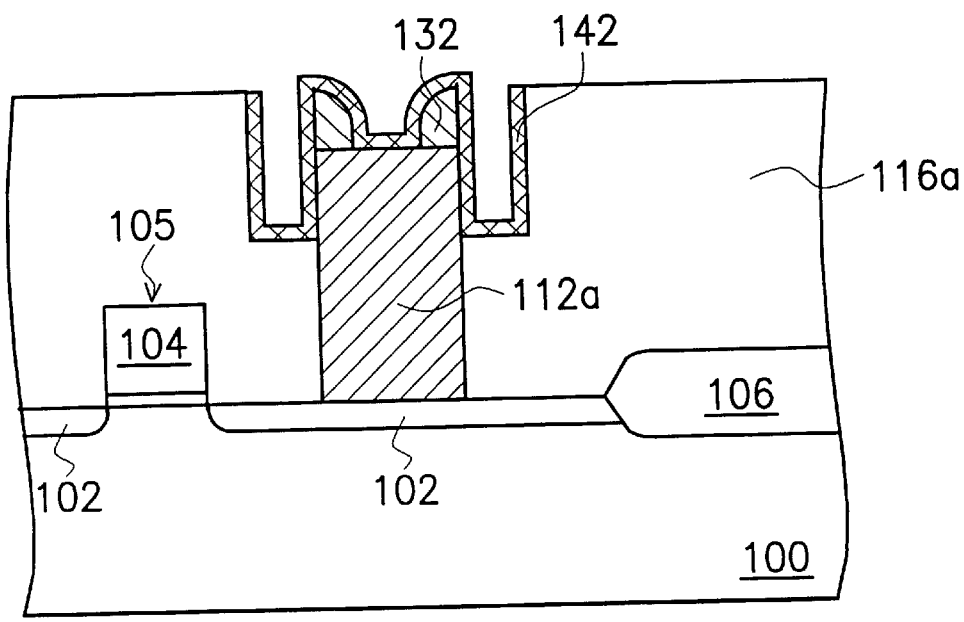

In FIG. 1F, the photo-resist layer 108 is removed. A conformal third conductive layer 142 is formed on surfaces of the dual trench structure 210, the plug 112a, and the horn region 132. As a consequence, a bottom electrode is formed comprising the conformal third conductive layer 142, the dual trench structure 210, the plug 112a, and the horn region 132. As shown from the figure, the bottom electrode has a surface level the same as the insulation layer 116a in the periphery region of the substrate 100. Therefore, an additional planarization process is not required for the subsequent fabrication process.

Figure 1G:
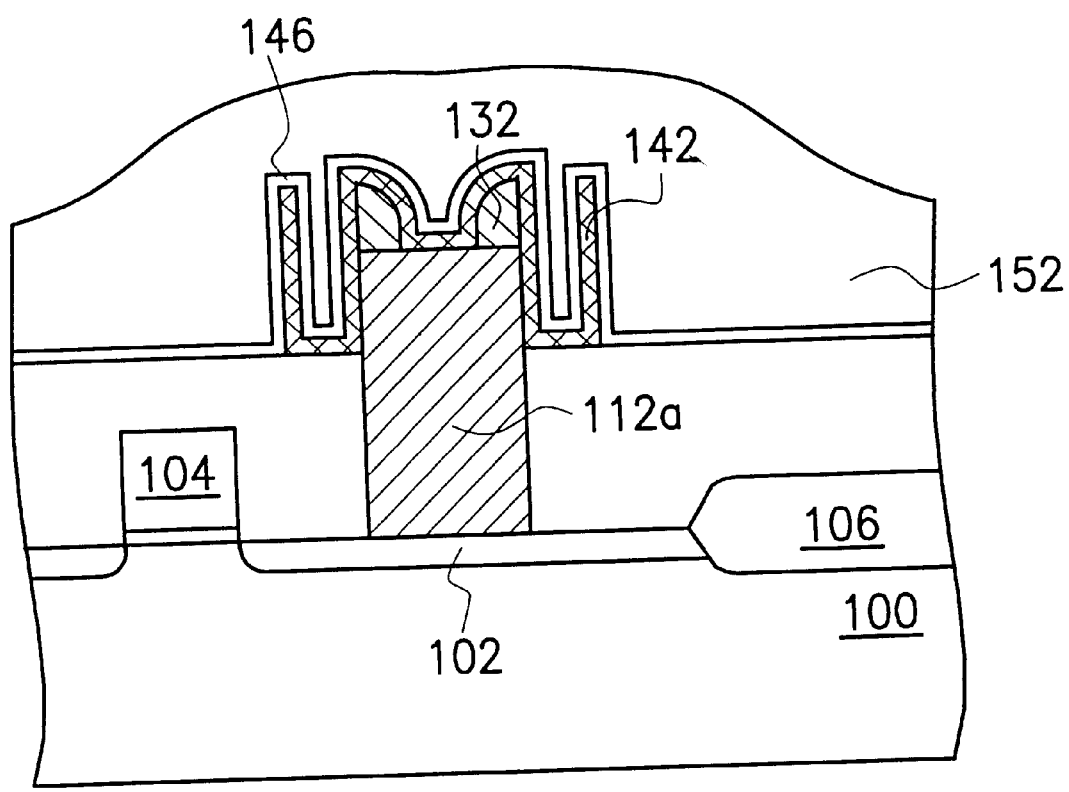

In FIG. 1G, a dielectric layer 146 having a thickness of about 10 Å to 60 Å is formed on the bottom electrode conformal thereto. The dielectric layer 146 may be formed by materials including silicon oxide, nitride/oxide (NO), oxide/nitride/oxide (ONO), or other dielectric with a high dielectric constant such as tantalum oxide ($Ta_2O_5$), lead zirconium titanate (PZT) or barium strontium titanate (BST). On the dielectric layer 146, a top electrode 152 is formed from a conductive material. A capacitor is thus formed comprising the bottom electrode, the dielectric layer 146, and the top electrode 152.

The invention provides a method of fabricating a dual trench capacitor typically used as the storage node in a random dynamic access memory. The dual trench structure with a horn region increases the surface area, and thus, increases the capacitance.

The capacitor formed by the method provided invention has a surface level about the same as the surface level of the periphery circuit. Therefore, an additional planarization process is not necessary in the following fabrication process.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a dual trench capacitor on a semiconductor substrate having at least a device isolation structure and a transistor thereon, wherein the transistor includes at least a gate and a source/drain region, the method comprising:

forming an insulation layer with an opening exposing the source/drain region;

filling the opening with a conductive plug, wherein the surface level of the plug is lower than the surface level of the insulation layer, so that a trench with a side wall of the insulation layer is formed on the plug within the opening;

forming a conductive spacer on the side wall, the conductive spacer being formed with a horn shape;

removing a part of the insulation layer which encompasses the conductive plug and the conductive spacer, so that a dual trench structure which exposes outer side walls of the conductive spacer and the conductive plug, and a part of the insulation layer is formed;

forming a conformal conductive layer to cover whole surfaces of the dual trench structure, the conductive spacer and the conductive plug, so that a bottom electrode is formed by the conformal conductive layer, the conductive spacer and the conductive plug; and forming a dielectric layer on the bottom electrode; and forming a top electrode on the dielectric layer.

2. The method according to claim 1, wherein the conductive plug comprises polysilicon.

3. The method according to claim 1, wherein the conductive spacer comprises polysilicon.

4. The method according to claim 1, wherein the conductive layer comprises polysilicon.

5. A method of forming a bottom electrode of a capacitor to couple a conductive region of a substrate, comprising:

forming an insulation layer with an opening exposing the conductive region on the substrate;

forming a plug with a surface level lower within the opening than a surface level of the insulation layer to couple the conductive region;

forming a conductive horn structure on the plug on an exposed side wall surface of the opening;

removing the insulation layer at the periphery of the opening;

forming a conductive layer conformal to the resulting profile of the substrate surface; and removing portions of the conductive layer on the insulation layer.

6. The method according to claim 5, wherein the plug comprises polysilicon.

7. The method according to claim 5, wherein the conductive horn structure comprises polysilicon.

8. The method according to claim 5, the step of forming the conductive horn structure comprising the steps of:

forming a conductive layer over the whole substrate; and removing portions of the conductive layer on the insulation layer and on the plug, so that the horn structure is formed on the exposed side wall of the opening.

9. The method according to claim 5, further comprising the steps of:

forming a dielectric layer to cover surfaces of the conductive layer, the horn structure, and the plug; and forming another conductive layer on the dielectric layer.

* * * * *